United States Patent [19]

Gazdik et al.

[11] Patent Number: 4,517,051

[45] Date of Patent: May 14, 1985

[54] MULTI-LAYER FLEXIBLE FILM MODULE

[75] Inventors: Charles E. Gazdik, Endicott; Donald G. McBride, Binghamton, both of N.Y.

[73] Assignee: IBM Corporation, Armonk, N.Y.

[21] Appl. No.: 599,839

[22] Filed: Apr. 13, 1984

Related U.S. Application Data

[62] Division of Ser. No. 453,443, Dec. 27, 1982.

[51] Int. Cl.³ .......................... C23F 1/02; B44C 1/22; C03C 15/00; B29C 17/08
[52] U.S. Cl. .................... 156/644; 156/652; 156/655; 156/659.1; 156/668
[58] Field of Search ............... 428/209; 29/846, 852; 174/68.5, 52 R; 264/104; 430/313, 317, 318, 316; 361/397, 398, 402, 409, 411, 412; 156/644, 650, 652, 655, 656, 659.1, 665, 668, 901, 902, 661.1

[56] References Cited

U.S. PATENT DOCUMENTS

| | | | |
|---|---|---|---|
| 3,823,467 | 7/1974 | Shamash et al. | 29/580 |
| 4,243,474 | 1/1981 | Shirai et al. | 156/630 |
| 4,306,925 | 12/1981 | Lebow et al. | 156/150 |
| 4,420,364 | 12/1983 | Nukii et al. | 156/631 |

Primary Examiner—William A. Powell
Attorney, Agent, or Firm—Mark Levy

[57] ABSTRACT

A high density electronic circuit module which includes a thin flexible film chip carrier having circuitry on both sides thereof. The double-sided thin, flexible circuitry is fabricated by depositing a first layer of chrome-copper-chrome circuitry on an aluminum substrate. This first layer of chrone-copper-chrome circuitry is covered with a layer of polyimide. Vias are etched into the polyimide. Next, a second layer of chrome-copper-chrome circuitry is deposited on top of the polyimide. The first and second layers of circuitry are connected through the etched vias. Finally, hydrochloric acid is utilized to etch away the aluminum substrate carrier. It is noted that hydrochloric acid etches aluminum whereas it does not etch chrome-copper-chrome circuitry.

6 Claims, 5 Drawing Figures

MULTI-LAYER FLEXIBLE FILM MODULE

This application is a division of application Ser. No. 453,443, filed Dec. 27, 1982.

BACKGROUND OF THE INVENTION

1. Field of the Invention

This invention relates to electronic packaging and more particularly to high density, low cost packaging of electronic circuitry.

2. Description of the Prior Art

The prior art shows electronic packages where integrated circuit chips are mounted on thin, flexible sheets of insulating material. For example, see U.S. Pat. Nos. 3,780,352 and 3,781,596.

The prior art also teaches various techniques for avoiding problems caused by thermal mismatch between integrated circuit chips and the support on which the chips are mounted. One known technique for avoiding problems due to thermal mismatch is to mount the chip on a flexible film carrier. For example, U.S. Pat. No. 4,231,154 shows an integrated circuit chip mounted on a very thin layer of circuitized polyimide.

Double sided circuitry is also well known. Such circuitry generally includes a carrier with circuitry on both sides of the carrier. The circuitry on the two sides of the carrier is generally interconnected by vias or thru holes. The carrier in such circuitry is generally a material such as epoxy glass which can be etched or drilled to provide passages for the via interconnections.

None of the prior art teaches how to fabricate circuitry on both sides of a thin polyimide carrier where the circuitry on the two sides of the carrier is interconnected by vias which are etched before the polyimide is cured.

It is noted that in order to etch vias into polyimide one must have uncured polyimide. The polyimide that is generally available in sheet form is cured polyimide. The reason that only cured polyimide is generally available in sheet form is that the process normally used for making sheet polyimide cures the polyimide during the fabrication process. If one fabricates circuitry on both sides of a "cured" polyimide sheet, one cannot etch thru holes or vias into the polyimide sheet using conventional photoresist and etch techniques.

SUMMARY OF THE INVENTION

It is an object of the present invention to provide a method of making high density electronic packages.

It is further an object of the present invention to provide an electronic package that includes an electronic chip mounted on a thin flexible film which has circuitry on both sides of the thin, flexible film.

It is further an object of the present invention to provide an electronic package that includes an electronic chip mounted on a thin flexible film which has circuitry on both sides of the film wherein the circuitry is interconnected by means of vias that have been etched in the film.

Another object of this invention is to provide a method of manufacturing the assembly described above utilizing a temporary support member.

In accordance with the present invention, an electronic package is provided which includes an electronic chip mounted on a thin layer of polyimide. The thin layer of polyimide includes circuitry on both of its surfaces. The two layers of circuitry are interconnected by means of vias that have been etched into the polyimide.

The polyimide with circuitry on both of its surfaces is fabricated by depositing a first layer of conventional chrome-copper-chrome circuitry on an aluminum carrier. This first layer of circuitry is covered with polyimide. Vias are etched into the polyimide and then the polyimide is fully cured. A second layer of conventional circuitry is deposited on the top surface of the polyimide. The aluminum carrier is then etched away using Hydrochloric acid.

The result is a thin film having circuitry on both of its surfaces. The two layers of circuitry are interconnected by means of etched vias. The aluminum can be etched away without damaging the circuitry since hydrochloric acid attacks aluminum but it does not attack chrome.

The foregoing and other objects, features, and advantages of the invention will be apparent from the following more particular description of a preferred embodiment of the invention, as illustrated in the accompanying drawings.

DESCRIPTION OF THE PREFERRED EMBODIMENT

Figure 1:
FIG. 1 shows the aluminum carrier used during the fabrication process of the present invention.

FIG. 1 shows the base layer of aluminum 10 used as a substrate in the present invention. This substrate can be a conventional, highly polished aluminum sheet 1/16 inch thick.

Figure 2:
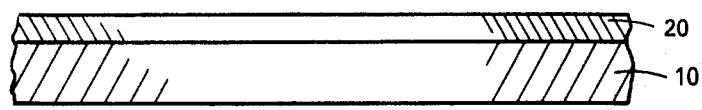
FIG. 2 shows the first step in the process wherein chrome-copper-chrome circuitry is deposited on the aluminum carrier.

In the first step of the invention, conventional chrome-copper-chrome circuitry 20 is deposited on top of the aluminum carrier as shown in FIG. 2. Circuitry 20 can be evaporated, sputtered or otherwise deposited in a conventional manner. Circuitry 20 can, for example, consist of conventional sputtered chrome-copper-chrome circuitry which is fabricated by sputtering 800 angstroms of chrome, followed by 40,000 angstroms of copper, and finally 800 angstroms of chrome. It should be noted that in the drawings the thickness of layer 20 (and likewise of layers 30 and 40) is exaggerated for ease of illustration.

The chrome-copper-chrome layer 20 is circuitized using standard photoresist and etching techniques. The techniques used to deposit the chrome-copper-chrome and to form a circuit pattern using photoresist can be the same techniques as those shown in the prior art. For example see U.S. Pat. No. 4,231,154.

Figure 3:
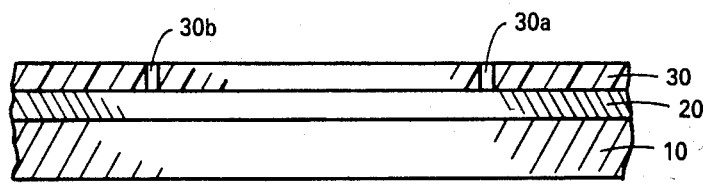
FIG. 3 shows the second step in the process where polyimide is deposited on top of the first layer of chrome-copper-chrome circuitry.

Next, a layer of liquid polyimide 30 is applied on top of the layer of chrome-copper-chrome circuitry 20 as shown in FIG. 3. The polyimide 30 can, for example, be commercially available material such as Dupont 5057. The polyimide 30 can be applied by various conventional techniques such as spinning or spraying. Layer 30 can be very thin. For example it may be in the range between 0.0002 and 0.0003 inches thick.

After the polyimide layer 30 is applied it can be stabilized by curing it to the B stage by the application of heat for a relatively short time. At this stage in the process, care must be taken not to fully cure the polyimide, since in the next step holes will be etched into the polyimide and it is not practical to etch holes in fully cured polyimide.

Next, holes 30A and 30B are etched into the uncured polyimide utilizing conventional photoresist and etch techniques. Holes 30A and 30B will be used as vias to make connections between the circuitry on the two sides of the polyimide film.

After holes 30A and 30B have been etched into the polyimide film, the polyimide is cured by a conventional baking step.

Figure 4:
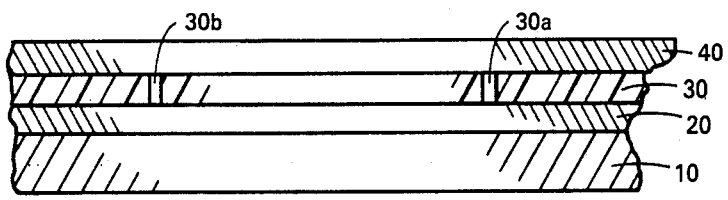
FIG. 4 shows the next step in the process wherein a second layer of chrome-copper-chrome circuitry is deposited on top of the layer of polyimide.

In the next step of the process, a second layer of chrome-copper-chrome circuitry 40 is deposited on the top of the layer of polyimide 30. The resultant structure is shown in FIG. 4. The top layer of chrome-copper-chrome circuitry 40 is deposited and circuitized in a conventional manner.

When top layer of circuitry 40 is deposited, metal is also deposited in vias 30A and 30B making connections between circuitry 20 and circuitry 30. Added reliability of the via interconnections can be achieved by first depositing a layer of interface material such as gold in vias 30A and 30B as shown in co-pending application Ser. No. 165320 filed July 2, 1980, abandoned and entitled "Multiplanar Integrated Circuit Substrate with Multilayer Metal Conductors".

After the top layer of circuitry 40 has been formed the aluminum substrate 10 is selectively etched to from cavity 10A. Substrate 10A is selectively etched by covering all of the surface 10B of substrate 10 (except area 10A) with a protective film (not shown) that is impervious to hydrochloric acid. Such films are commercially available. Next the substrate is exposed to hydrochloric acid to etch cavity 10A. It is noted that hydrochloric acid will etch the aluminum substrate 10 but it will not attach the chrome-copper-chrome circuitry 20.

Figure 5:
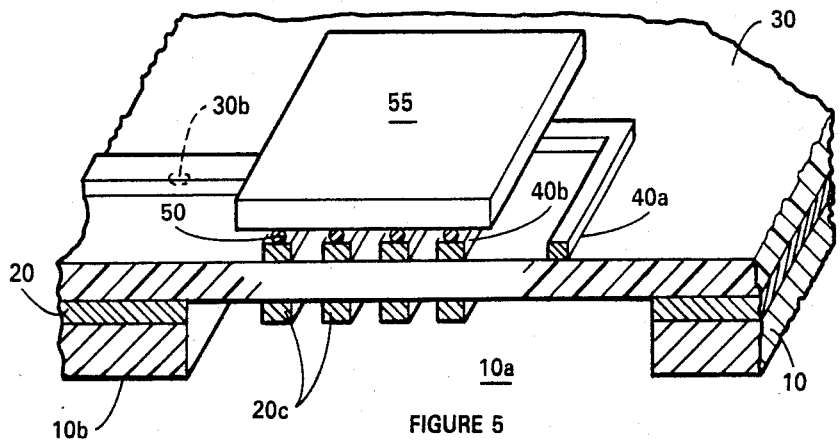
FIG. 5 shows the resultant package wherein the aluminum carrier has been etched away and an integrated circuit chip has been mounted on the thin layer of polyimide.

In its final form, as shown in FIG. 5, the package fabricated in accordance with the present invention includes an integrated circuit chip 55 which is connected to circuitry 20 and 30 by means of solder ball joints 50 (generally referred to as C4 joints). In FIG. 5 the circuit pattern which has been etched into layer 20 is designated 20C. The circuitry that has been etched into layer 40 is designated 40A and 40B. In FIG. 5 only one of the via connections 30B between circuit layer 20 and circuit layer 30 is shown.

The technique of the present invention allows one to form circuitry on both sides of a very thin flexible polyimide film 30 which includes etched vias such as 30A and 30B. Prior techniques for forming two sided interconnected circuitry required a much thicker and rigid substrate. Since substrate 30 is thin and flexible it can absorb any thermal mismatch between integrated circuit 55 and the aluminum carrier 10.

A more detailed explanation of the various steps in the particular embodiment of the process shown herein is as follows:

1. Form a layer of circuitry 20 on a highly polished aluminum carrier 10. Circuit layer 20 can for example be formed by evaporating, sputtering, or otherwise depositing 800 angstroms of chromium followed by 40,000 angstroms of copper, followed by 800 angstroms of chromium. Sputtering can be done using conventional techniques.

2. Circuitize the chrome-copper-chrome metallurgy 20 using standard photoresist and etching techniques. (for example see steps 18 to 22 below).

3. Apply a 0.0002 to 0.0003 inch thick layer 30 of liquid polyimide (e.g., Dupont 5057) onto the chromium surface by conventional spinning, or spraying techniques.

4. Cure polyimide layer 30 to the B stage only by heating to 120 degrees F. for 20 minutes.

5. Apply a layer of photoresist to top of the polyimide layer 30. Conventional photoresist such as KTFR can be used.

6. Expose the desired via pattern (for example vias 30A and 30B).

7. Develop the via pattern.

8. Etch the vias with KOH (potassium hydroxide).

9. Strip the photoresist with J100 (Kodak).

10. Cure the polyimide 30 with a high temperature, e.g., 350 C. for 5 minutes in a nitrogen or other inert atmosphere.

11. Deposit a second layer of chrome-copper-chrome circuitry 40 by evaporating, sputtering, or otherwise depositing 800 angstroms of chromium, 40,000 angstroms of copper and, finally 800 angstrom top layer of chromium onto the cured polyimide.

12. Apply photoresist (KTFR) onto the chromium surface.

13. Expose the the C4 land patterns 40B.

14. Develop out C-4 areas 40B.

15. Etch top chromium from land patterns 40B with KMnO/KOH (potassium permanganate/potassium hydroxide).

16. Gold plate 20–50 microinches of gold onto the tabs 40B (for example Sel Rex Pure A Gold 125 could be used). The tabs for C-4 joints could also just be tinned.

17. Strip photoresist.

18. Reapply photoresist KTFR (Kodak Thin Film Resist).

19. Expose circuit pattern desired in layer 40.

20. Develop photoresist to the desired circuit pattern in layer 40.

21. Etch circuitry into layer 40 with standard etchants. For example use KMnO/KOH, FeCl, (ferric chloride) and KMnO/KOH.

22. Strip the photoresist.

23. Protect the front side circuit layer 40 and area of substrate 10 other than cavity 10A with a temporary organic layer (e.g., Apiezon wax, commercially available from the James Biddle, Co.) or with a mechanical cover.

24. Etch the aluminum carrier in area 10A with HCl.

25. Place device chip 55 onto the C-4 pads 40B.

26. Reflow device chip 55 to the C-4 pads in a conveyor furnace (standard C-4 joining).

While the invention has been particularly shown and described with reference to preferred embodiment thereof, it will be understood by those skilled in the art that various changes in form and detail may be made therein without departing from the spirit and scope of the invention.

We claim:

1. The method of making double-sided thin, flexible circuitry by depositing a first layer of circuitry on a substrate, covering said first layer of circuitry with a thin layer of polyimide,
etching vias into said layer of polyimide,
curing said polyimide,
depositing a second layer of circuitry on top of said polyimide, and
etching away said substrate with a material that attacks said substrate but which does not attack said first layer of circuitry.

2. The method of making double-sided thin, flexible circuitry by
depositing a first layer of chrome copper chrome circuitry on an aluminum substrate,
covering said first layer of circuitry with a thin layer of polyimide,
etching via holes in said polyimide layer,
curing said polyimide layer,
depositing a second layer of chrome copper chrome circuitry on top of said polyimide, said first and second layers of circuitry being connected through said vias, and
utilizing hydrochloric acid to etch away the aluminum substrate.

3. The method of making double-sided thin, flexible circuitry by
depositing chrome-copper-chrome circuitry on an aluminum substrate,
covering said first layer of circuitry with a thin layer of polyimide,
etching via holes in said polyimide layer,
curing said polyimide layer,
depositing a second layer of chrome-copper-chrome circuitry on top of said polyimide, said first and second layers of circuitry being connected through said vias,
covering all except a selected area of said aluminum substrate with material impervious to hydrochloric acid, and
utilizing hydrochloric acid to etch away the aluminum substrate in said selected area.

4. The method of making double-sided thin, flexible circuitry by
depositing a first layer of circuitry on a substrate made of a first material,
covering said first layer of circuitry with a thin layer of insulating material,
etching vias into said layer of insulating material,
depositing a second layer of circuitry on top of said layer of insulating material, and
etching away the substrate with a material that attacks said substrate but which does not attack said first layer of circuitry.

5. The method in claim 1 wherein said first layer of circuitry is fabricated from chrome-copper-chrome,
wherein said substrate is fabricated from aluminum, and
wherein said aluminum is etched using hydrochloric acid.

6. The method recited in claim 4 wherein said first layer of circuitry is fabricated from chrome-copper-chrome,
wherein said substrate is fabricated from aluminum,
wherein said aluminum is etched using hydrochloric acid.

* * * * *